US012748899B2

(12) United States Patent
Estavillo-Torrellas et al.

(10) Patent No.: US 12,748,899 B2
(45) Date of Patent: Sep. 29, 2026

(54) ELECTROMAGNETIC EFFECTS ANALYSIS ON A STRUCTURAL SECTION OF AN AIRCRAFT

(71) Applicant: The Boeing Company, Chicago, IL (US)

(72) Inventors: Edgardo E. Estavillo-Torrellas, Tucson, AZ (US); Benjamin Westin, Charleston, SC (US); Terry R. Vogler, Charleston, SC (US)

(73) Assignee: The Boeing Company, Chicago, IL (US)

( * ) Notice: Subject to any disclaimer, the term of this patent is extended or adjusted under 35 U.S.C. 154(b) by 1199 days.

(21) Appl. No.: 17/724,073

(22) Filed: Apr. 19, 2022

(65) Prior Publication Data

US 2023/0004692 A1 Jan. 5, 2023

Related U.S. Application Data

(60) Provisional application No. 63/202,964, filed on Jul. 1, 2021.

(51) Int. Cl.
*G06F 30/15* (2020.01)
*B64F 5/60* (2017.01)

(52) U.S. Cl.
CPC ................ *G06F 30/15* (2020.01); *B64F 5/60* (2017.01)

(58) Field of Classification Search
None
See application file for complete search history.

(56) References Cited

U.S. PATENT DOCUMENTS 7,437,688 B2 * 10/2008 Graham .................. G06F 30/00 703/1
7,925,453 B2 * 4/2011 Bhattacharya ......... G06Q 10/06 702/34
7,934,676 B2 * 5/2011 Dufresne ............... B64D 45/02 244/133
10,282,896 B1 * 5/2019 Petri ........................ G06F 30/00
10,295,438 B2 * 5/2019 Lester ....................... B64C 3/28

(Continued)

OTHER PUBLICATIONS

Chen, et al., "Simulation and analysis of EMP transient electromagnetic effect of aircraft," The 14th IET International Conference on AC and DC Power Transmission. (Year: 2018).*

*Primary Examiner* — Ryan F Pitaro
*Assistant Examiner* — Joseph P Morris
(74) *Attorney, Agent, or Firm* — Harrity & Harrity, LLP

(57) ABSTRACT

A method for analysis of electromagnetic effects (EME) on a structural section of an aircraft is provided. The method includes producing a computer-aided design (CAD) model of the structural section of the aircraft including a plurality of ribs defining bays, and identifiers of designated routing of system wiring through one or more of the bays. An engineering analysis of the structural section is performed based on the CAD model to determine electrical threshold values for locations for the one or more of the bays. The method includes identifying any of the locations at which an electrical threshold value exceeds a predetermined threshold associated with a keep-out distance relative to the system wiring. And the method includes generating an output including information of those of the locations that are identified, and indicia for indicating a recommended modification to address the EME threat.

24 Claims, 9 Drawing Sheets

(56) References Cited

U.S. PATENT DOCUMENTS

| | | | | |
|---|---|---|---|---|
| 11,416,646 | B2 * | 8/2022 | Westin | G06F 30/12 |
| 12,147,745 | B2 * | 11/2024 | Westin | G06F 30/23 |
| 2006/0173662 | A1 * | 8/2006 | Kazama | G06F 30/367 703/4 |
| 2020/0097624 | A1 * | 3/2020 | Westin | G06F 30/23 |
| 2020/0285713 | A1 * | 9/2020 | DeVore | G06F 30/15 |
| 2022/0244029 | A1 * | 8/2022 | Adriano | G01B 5/20 |

* cited by examiner

ELECTROMAGNETIC EFFECTS ANALYSIS ON A STRUCTURAL SECTION OF AN AIRCRAFT

CROSS-REFERENCE TO RELATED APPLICATION(S)

This application claims priority to U.S. Provisional Application No. 63/202,964, filed Jul. 1, 2021, entitled Electromagnetic Effects Analysis on a Structural Section of an Aircraft, the content of which is incorporated herein by reference in its entirety.

TECHNOLOGICAL FIELD

The present disclosure relates generally to designing and manufacturing a structural product, and in particular, to electromagnetic effects (EME) analysis on a structural section of an aircraft.

BACKGROUND

Electromagnetic effects (EME) uses computational electromagnetics models to analyze many types of electromagnetic threats to structural products, which is useful in the design, manufacture and sustainment of these structural products. These threats include radiated and conducted energy due to lightning and other threats, as well as electrostatics. These threats are a concern of many industries such as the aircraft, power generation and petrochemical industries. Certain structural products in these industries are susceptible to lightning strikes and other electromagnetic threats.

Each EME threat requires a specific model of the same structural-product design, and these models often take months to build. Existing approaches to building EME models typically include a modeler requesting design data from design engineers via email, and manually converting their interpretation of the data into an EME model. Existing techniques often require multiple iterations to optimize system routing of system wiring, and appropriate computer models can take months to develop. There is also no defined method for balancing EME requirements for system routing wiring and other system elements, and additional "keep-out" zones are only described relative to other features. As a result, the only way to verify that routing meets requirements is through visual inspection, and any detailed analysis for exceptions or revised requirements can take a long time.

It would therefore be desirable to have a system and method that takes into account at least some of the issues discussed above, as well as other possible issues.

BRIEF SUMMARY

Example implementations of the present disclosure are directed to designing and manufacturing a structural product, and in particular, to electromagnetic effects (EME) analysis on a structural section of an aircraft. In accordance with example implementations, through development of system routing requirements, voltage requirements and dimension guidelines for keep-out zones may be generated. Model-based engineering tools may be used to create an EME model with information that may be linked to the aircraft design.

Densely-packed probes may be used throughout a computer-aided design (CAD) model or other computer model of the structural section such as a wing. These may be aggregated into requirements that may be tailored by a user, and from which a visual representation may be generated that indicates locations that exceed requirements ("keep-out zones"). The process may be iterated quickly to find the optimal systems routing, by varying voltage requirements values, and visualizing the effect on each location. The keep-out zones may be generated in geometry such as 3D geometry that identifies systems routing violating these requirements, and simulation data may be tied back to the aircraft design.

The present disclosure thus includes, without limitation, the following example implementations.

Some example implementations provide an apparatus for analysis of electromagnetic effects (EME) on a structural section of an aircraft, the apparatus comprising a memory configured to store computer-readable program code; and processing circuitry configured to access the memory, and execute the computer-readable program code to cause the apparatus to at least: produce a computer-aided design (CAD) model of the structural section of the aircraft including a plurality of ribs defining bays, with apertures in one or more of the bays and identifiers of designated routing of system wiring through the one or more of the bays; perform an engineering analysis of the structural section based on the CAD model to determine electrical threshold values for locations for the one or more of the bays, which are related to an effect of electromagnetic radiation associated with an impact of an EME threat on the system wiring; identify any of the locations at which an electrical threshold value exceeds a predetermined threshold associated with a keep-out distance relative to the system wiring; and generate an output including information of those of the locations that are identified, and indicia for indicating a recommended modification to at least one of the designated routing, the system wiring or the one or more of the bays in order to address the EME threat.

Some example implementations provide a method of analysis of electromagnetic effects (EME) on a structural section of an aircraft, the method comprising producing a computer-aided design (CAD) model of the structural section of the aircraft including a plurality of ribs defining bays, with apertures in one or more of the bays and identifiers of designated routing of system wiring through the one or more of the bays; performing an engineering analysis of the structural section based on the CAD model to determine electrical threshold values for locations for the one or more of the bays, which are related to an effect of electromagnetic radiation associated with an impact of an EME threat on the system wiring; identifying any of the locations at which an electrical threshold value exceeds a predetermined threshold associated with a keep-out distance relative to the system wiring; and generating an output including information of those of the locations that are identified, and indicia for indicating a recommended modification to at least one of the designated routing, the system wiring or the one or more of the bays in order to address the EME threat.

Some example implementations provide a computer-readable storage medium for analysis of electromagnetic effects (EME) on a structural section of an aircraft, the computer-readable storage medium being non-transitory and having computer-readable program code stored therein that, in response to execution by processing circuitry, causes an apparatus to at least produce a computer-aided design (CAD) model of the structural section of the aircraft including a plurality of ribs defining bays, with apertures in one or more of the bays and identifiers of designated routing of system wiring through the one or more of the bays; perform an engineering analysis of the structural section based on the CAD model to determine electrical threshold values for locations for the one or more of the bays, which are related to an effect of electromagnetic radiation associated with an impact of an EME threat on the system wiring; identify any of the locations at which an electrical threshold value exceeds a predetermined threshold associated with a keep-out distance relative to the system wiring; and generate an output including information of those of the locations that are identified, and indicia for indicating a recommended modification to at least one of the designated routing, the system wiring or the one or more of the bays in order to address the EME threat.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

DETAILED DESCRIPTION

Figure 1:
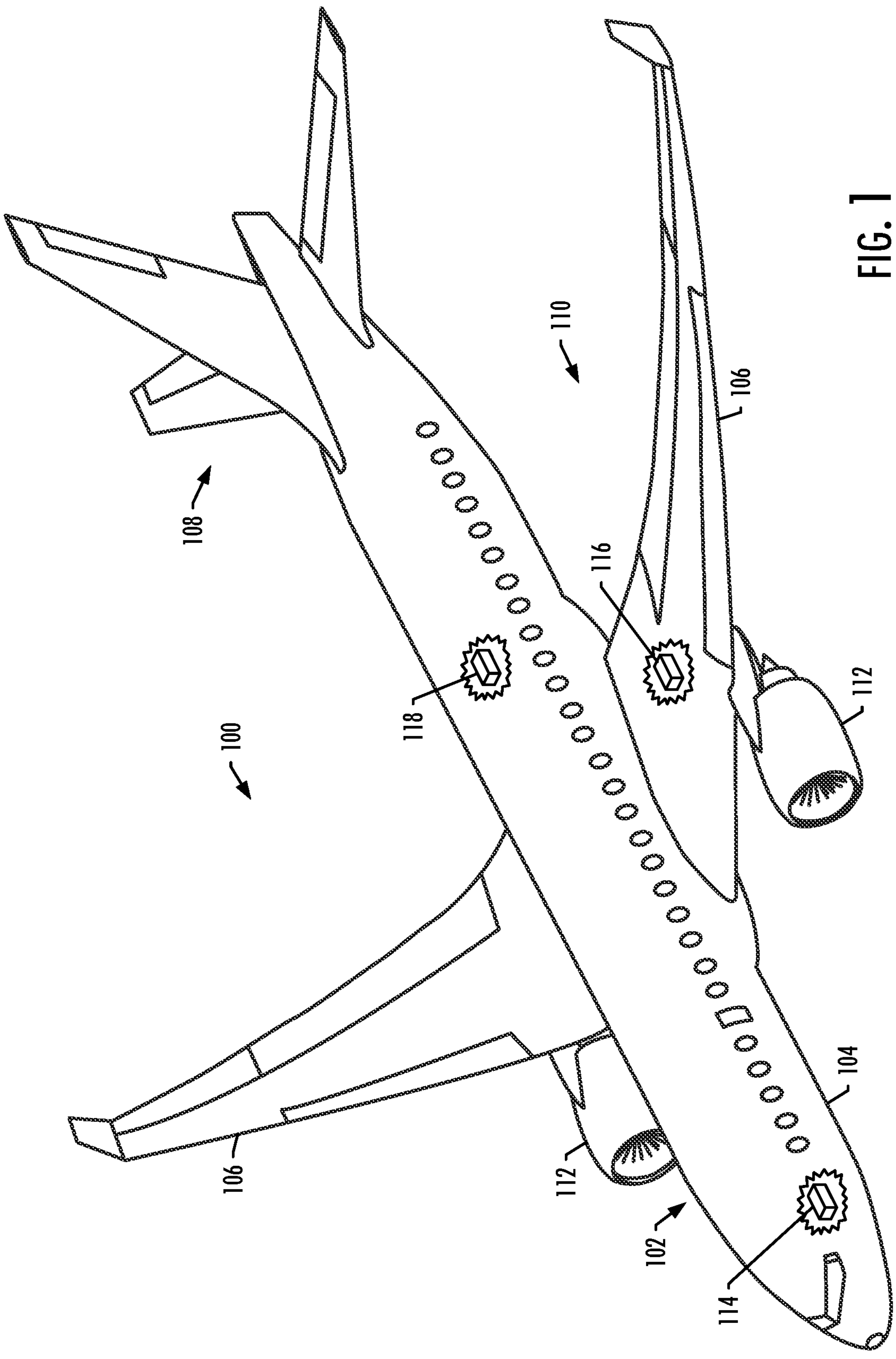
FIG. 1 illustrates an aircraft according to some example implementations of the present disclosure.

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Like reference numerals refer to like elements throughout.

Unless specified otherwise or clear from context, references to first, second or the like should not be construed to imply a particular order. A feature described as being above another feature (unless specified otherwise or clear from context) may instead be below, and vice versa; and similarly, features described as being to the left of another feature else may instead be to the right, and vice versa. Also, while reference may be made herein to quantitative measures, values, geometric relationships or the like, unless otherwise stated, any one or more if not all of these may be absolute or approximate to account for acceptable variations that may occur, such as those due to engineering tolerances or the like.

As used herein, unless specified otherwise or clear from context, the "or" of a set of operands is the "inclusive or" and thereby true if and only if one or more of the operands is true, as opposed to the "exclusive or" which is false when all of the operands are true. Thus, for example, "[A] or [B]" is true if [A] is true, or if [B] is true, or if both [A] and [B] are true. Further, the articles "a" and "an" mean "one or more," unless specified otherwise or clear from context to be directed to a singular form. Furthermore, it should be understood that unless otherwise specified, the terms "data," "content," "digital content," "information," and similar terms may be at times used interchangeably.

FIG. 1 illustrates one type of aircraft 100 that may benefit from example implementations of the present disclosure. As shown, the aircraft includes an airframe 102 with a fuselage 104, wings 106 and tail 108. The aircraft also includes a plurality of high-level systems 110 such as a propulsion system. In the particular example shown in FIG. 1, the propulsion system includes two wing-mounted engines 112. In other embodiments, the propulsion system can include other arrangements, for example, engines carried by other portions of the aircraft including the fuselage and/or the tail. The high-level systems may also include an electrical system 114, hydraulic system 116 and/or environmental system 118. Any number of other systems may be included.

Figure 2:
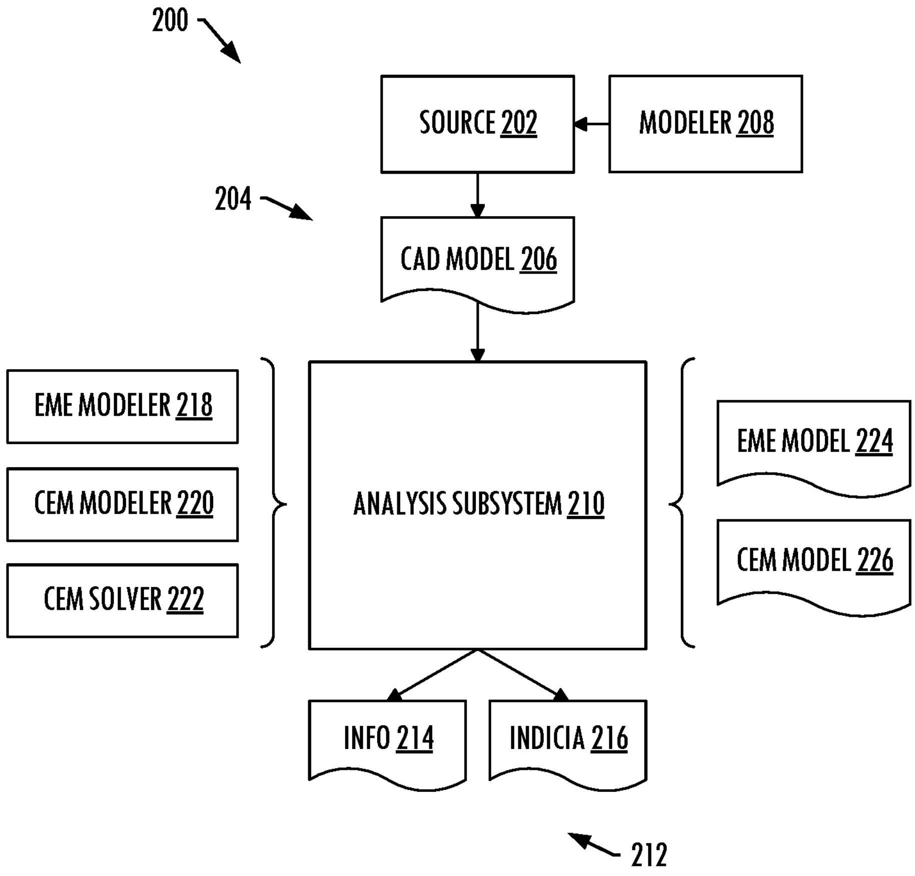
FIG. 2 illustrates a system for analysis of electromagnetic effects (EME) on a structural section of an aircraft, according to some example implementations.

FIG. 2 illustrates a system 200 for a system for analysis of electromagnetic effects (EME) on a structural section of an aircraft like the aircraft 100 of FIG. 1, according to some example implementations. As explained in greater detail below, in the context of some structural sections such as wings of an aircraft, the structural section includes a plurality of ribs defining bays. The structural section has apertures in one or more of the bays, and identifiers of designated routing of system wiring through the one or more of the bays.

The system 200 may include any of a number of different subsystems, tools and the like (each an individual system) for performing one or more functions or operations. As shown, in some examples, the system includes at least one source 202 of authoritative data 204 for the aircraft structure. In some examples, the source includes a memory that may be located at a single source or distributed across multiple sources. The authoritative data may be stored in a number of different manners, such as in a database or flat files of any of a number of different types or formats. More particularly, for example, the authoritative data may be stored in a product lifecycle management (PLM) solution, product data management (PDM) solution or the like, which may be hosted on at least one source.

In some examples, the authoritative data 204 includes a computer-aided design (CAD) model 206 of the structural section of the aircraft. At least some of the authoritative data may be produced by a modeler 208 using a commercially-available computer-aided design (CAD) system, such as CATIA, SolidWorks or the like.

The system 200 of example implementations of the present disclosure includes an analysis subsystem 210 configured to perform an engineering analysis of the structural section based on the CAD model 206 to determine electrical threshold values for locations for the one or more of the bays, which are related to an effect of electromagnetic radiation associated with an impact of an EME threat on the system wiring. These EME threats may include lightning direct effects (LDE), indirect effects of lightning, high-intensity radiated fields (HIRF), refueling electrostatics, aircraft-level lightning attachment zoning, and the like. The analysis subsystem is configured to identify any of the locations at which an electrical threshold value exceeds a predetermined threshold associated with a keep-out distance relative to the system wiring. The analysis subsystem, then, is configured to generate an output 212 including information 214 of those of the locations that are identified, and indicia 216 for indicating a recommended modification to at least one of the designated routing, the system wiring or the one or more of the bays in order to address the EME threat.

The keep-out distances for the bays may be managed in a number of different manners. In some examples in which the structural section includes a plurality of ribs, a threat table may be developed that includes predetermined threshold voltages for respective ones of the ribs. The keep-out distances may be expressed as keep-out zones that are managed as a list of distances from aircraft features adjacent the bays. A suitable threat table and keep-out zone table may be structured as follows according to some examples:

Voltage Table

| Rib | Voltage |
|---|---|
| 1 | 200 |
| 2 | 400 |
| 3 | 600 |
| 4 | 700 |
| 5 | 1000 |
| 6 | 1300 |
| 7 | 1500 |
| 8 | 1800 |
| 9 | 2000 |
| 10 | 2300 |

Keep-Out Zones Table

| Bay | d(in) | h(in) |
|---|---|---|
| 1 | N/A | N/A |
| 2, 3 | 10 | 20 |
| 4-6 | 15 | 20 |
| 7, 8 | N/A | N/A |
| 9, 10 | 20 | 30 |

In some examples, the analysis subsystem 210 includes or communicates with an EME modeler 218, a computational electromagnetics (CEM) modeler 220, and a CEM solver 222. These and other subsystems of the system 200 may be co-located or directly coupled to one another. In some examples, various ones of the subsystems, tools and the like may communicate with one another across one or more computer networks. Further, although shown as part of the system, it should be understood that any one or more of the subsystems, tools and the like may function or operate as a separate system without regard to any of the other subsystems, tools and the like. It should also be understood that the system may include one or more additional or alternative subsystems, tools and the like than those shown in FIG. 2.

According to example implementations of the present disclosure, the EME modeler 218 is configured to generate an EME model 224 of the structural section from the CAD model 206. The CEM modeler 220 is configured to generate a computational electromagnetics (CEM) model 226 of the structural section from the EME model.

Computational electromagnetics is known as a modeling of the interaction of electromagnetic fields with physical objects and the environment. The CEM model 226 may be any of a number of suitable types of CEM models such as a finite-difference time-domain (FDTD) model, method of moments (MOM) model, finite element method (FEM) model and the like. Other examples of suitable models include those for analyses such as asymptotic high-frequency method analyses (e.g., ray-tracing, uniform geometrical theory of diffraction, geometrical theory of diffraction), electrostatics, electro-hydrodynamics (EHD) (e.g., refueling situation), two-dimensional (2D) multi-wire transmission line analyses and the like. The CEM modeler 220 may be, include or otherwise benefit from proprietary software and/or commercially-available software. Examples of suitable commercially-available software includes Altair HyperView and FEKO, both available from Altair Engineering, Inc.; the ANSYS software suite (including HFSS), available from ANSYS, Inc. of Canonsburg, Pa.; COMSOL Multiphysics® (FEMLAB), available from COMSOL Inc. of Burlington, Massachusetts; the CST Studio Suite and Simulia, both available from Simulia (a subsidiary of Dassault Systèmes); and the like.

The CEM solver 222 is configured to perform a CEM analysis in which the CEM model 226 is exposed to a simulated EME threat that corresponds to the EME threat to predict an impact of the EME threat on the system wiring. Examples of suitable CEM analyses include FDTD analysis, MOM analysis, FEM analyses and the like. Other examples of suitable analyses include asymptotic high-frequency method analyses (e.g., ray-tracing, uniform geometrical theory of diffraction, geometrical theory of diffraction), electrostatics, EHD (e.g., refueling situation), 2D multi-wire transmission line analyses and the like. Likewise, the CEM solver may be, include or otherwise benefit from proprietary software and/or commercially-available software. Examples of suitable commercially-available software includes the Abaqus Unified FEA product suite, available from Simulia; Altair HyperView; the ANSYS software suite; the CATIA; COMSOL Multiphysics® (FEMLAB); CST Studio Suite; FEKO; LS-DYNA®, available from Livermore Software Technology Corporation (LSTC) of Livemore, California; Mathcad, available from PTC, Inc. of Boston, Massachusetts; MATLAB®, available from MathWorks of Natick, Massachusetts; NASTRAN/PATRAN, available from MSC Software Corporation; NX (Unigraphics), available from Siemens PLM Software of Plano, Texas; SolidWorks; and the like.

In some examples, the EME modeler 218 configured to generate the EME model 224 includes the EME modeler configured to assign digital representations of probes to individual ones of the bays represented in the EME model, and also thereby the CEM model 226. In some of these examples, the CEM solver is configured to use the probes to monitor electrical properties of the bays as the CEM model is exposed to the simulated EME threat. In some further examples, the digital representations of the probes are assigned with a user-defined probe density, and the apparatus caused to perform the CEM analysis further includes the apparatus caused to use the probes to determine spacing between ribs of the plurality of ribs.

In some examples, the analysis subsystem 210 is further configured to generate at least one alternate routing of the system wiring based on those of the locations that are identified, and the indicia 216 for indicating the recommended modification includes the at least one alternate routing. In some of these examples, this includes the analysis subsystem configured to identify portions of the designated routing at those of the locations that are identified at which the electrical threshold value exceeds the predetermined threshold. The analysis subsystem is configured to generate corresponding alternate portions of routing for the portions of the designated routing that are identified. In this regard, the corresponding alternate portions of routing are repositioned to a modified location within the one or more bays based on the keep-out distance relative to the system wiring. And the analysis subsystem is configured to replace the portions with the corresponding alternate portions in the designated routing to thereby generate an alternate routing of the system wiring.

In some examples, the analysis subsystem 210 is configured to further add bonds to one or more of the apertures through which system wiring is passed according to the designated routing, and the indicia 216 for indicating the recommended modification includes the bonds as added. These bonds are electrical bonds used to reduce if not minimize EME hazards in a fuel tank of the aircraft. In this regard, an electrical bond may function to "reset" voltage integrated along a path to zero for a next sequential set of ribs of the plurality of ribs.

Additionally or alternatively, in some examples, the analysis subsystem 210 is further configured to generate at least one alternative predetermined threshold associated with the keep-out distance based on those of the locations that are identified. In these examples, the indicia for indicating the recommended modification includes the at least one alternative predetermined threshold.

Figure 3A:
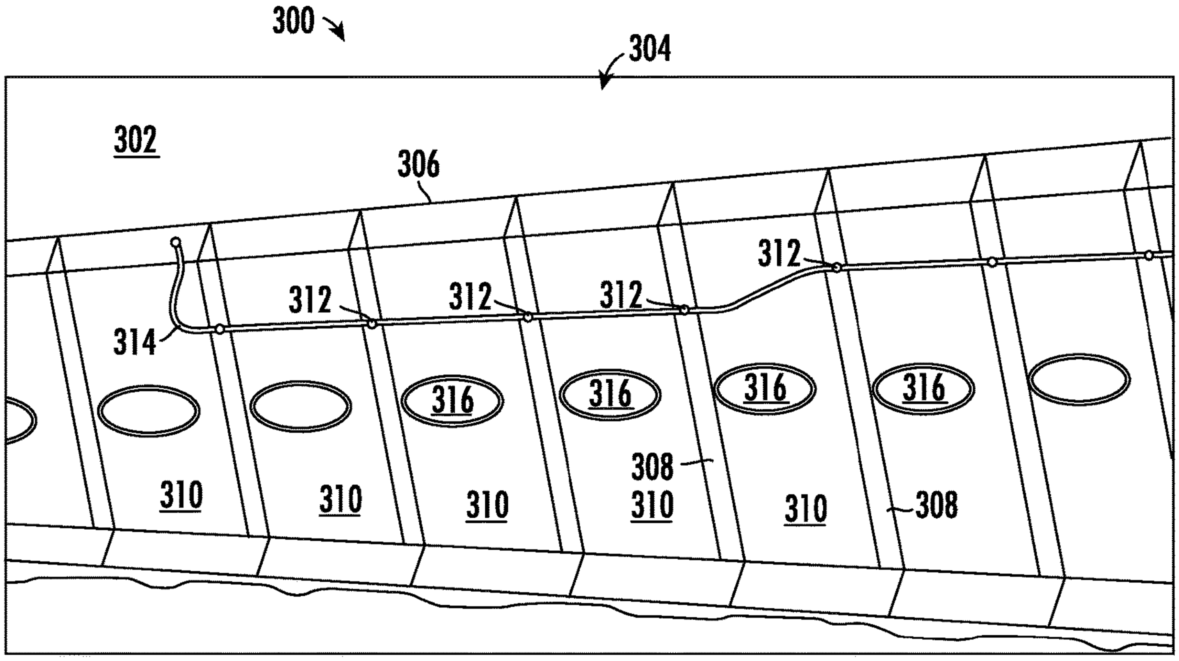
FIGS. 3A, 3B, 3C, 3D and 3E illustrate a graphical user interface (GU) of software that may be used to implement aspects of example implementations.

FIGS. 3A-3E illustrate a graphical user interface (GUI) 300 of software that may be used to implement aspects of example implementations of the present disclosure. As shown in FIG. 3A, the GUI includes a workspace 302 with a CAD model 304 for a structural section 306 of an aircraft such as a wing. As shown, the structural section includes a plurality of ribs 308 defining bays 310 (only a few of which are called out in the figure). As shown, the structural section has apertures 312 in one or more of the bays, and identifiers of designated routing of system wiring 314 through the one or more of the bays. Also shown are keep-out zones 316 that express keep-out distances relative to the system wiring.

Figure 3B:
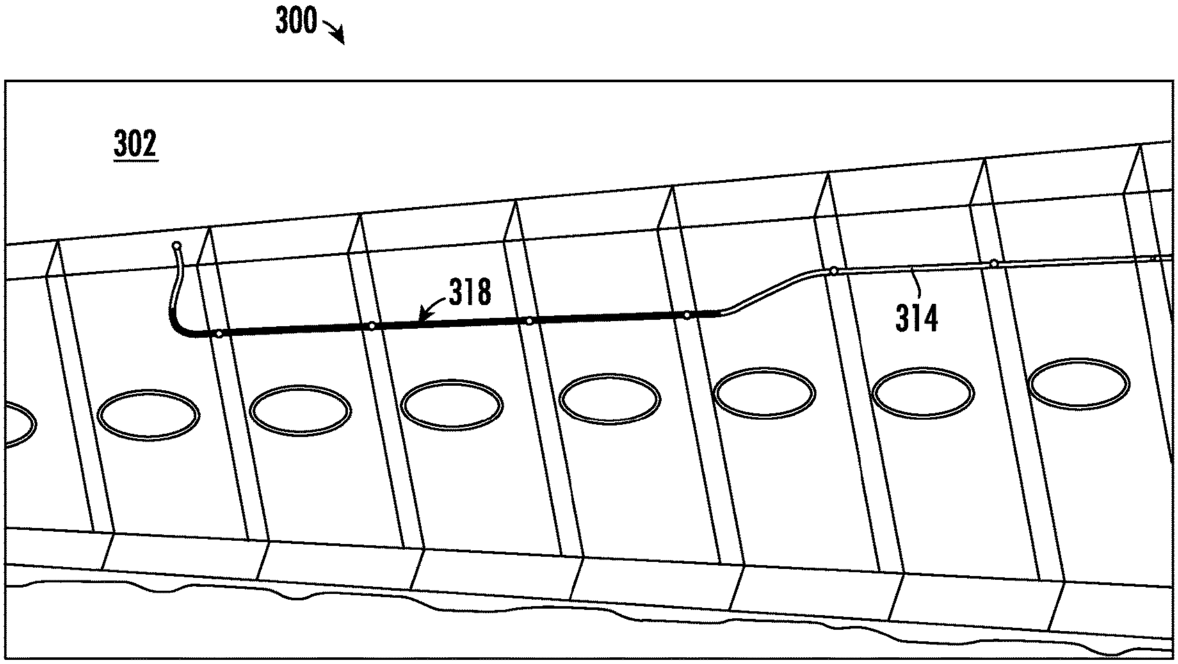

The analysis subsystem 210 is configured to perform an engineering analysis of the structural section 306 based on the CAD model 304 to determine electrical threshold values for locations for the one or more of the bays 310, which are related to an effect of electromagnetic radiation associated with an impact of an EME threat on the system wiring 314. The analysis subsystem is configured to identify any of the locations at which an electrical threshold value exceeds a predetermined threshold associated with a keep-out distance relative to the system wiring. As shown in FIG. 3B, in some of these examples, this includes the analysis subsystem configured to identify portions 318 of the designated routing at those of the locations that are identified at which the electrical threshold value exceeds the predetermined threshold.

Figure 3C:
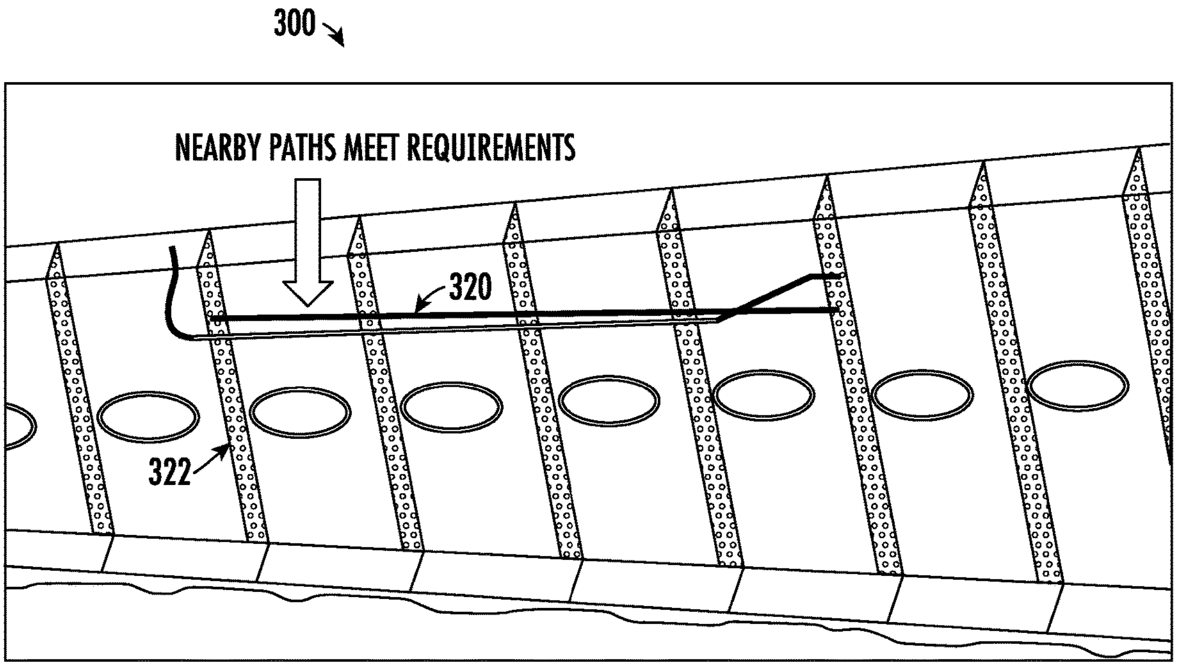
Figure 3D:
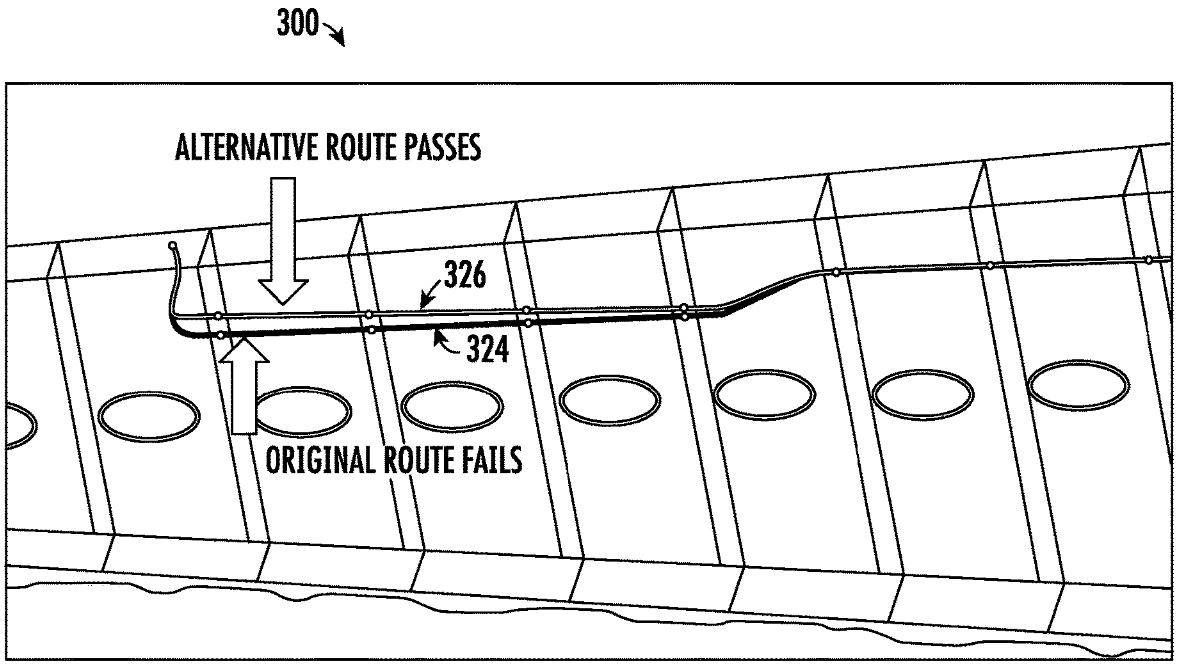

As shown in FIG. 3C, in some examples, the analysis subsystem 210 is configured to generate corresponding alternate portions 320 of routing for the portions of the designated routing that are identified. This may include the use of digital representations of probes 322 to individual ones of the bays 310 to monitor electrical properties of the bays, and a similar analysis of various alternate portions of routing. FIG. 3D, then, illustrates the original, designated routing 324 of the system wiring 314, and an alternate routing 326 of the system wiring. As shown, the corresponding alternate portions of routing are repositioned to a modified location within the one or more bays 310 based on the keep-out distance relative to the system wiring.

Figure 3E:
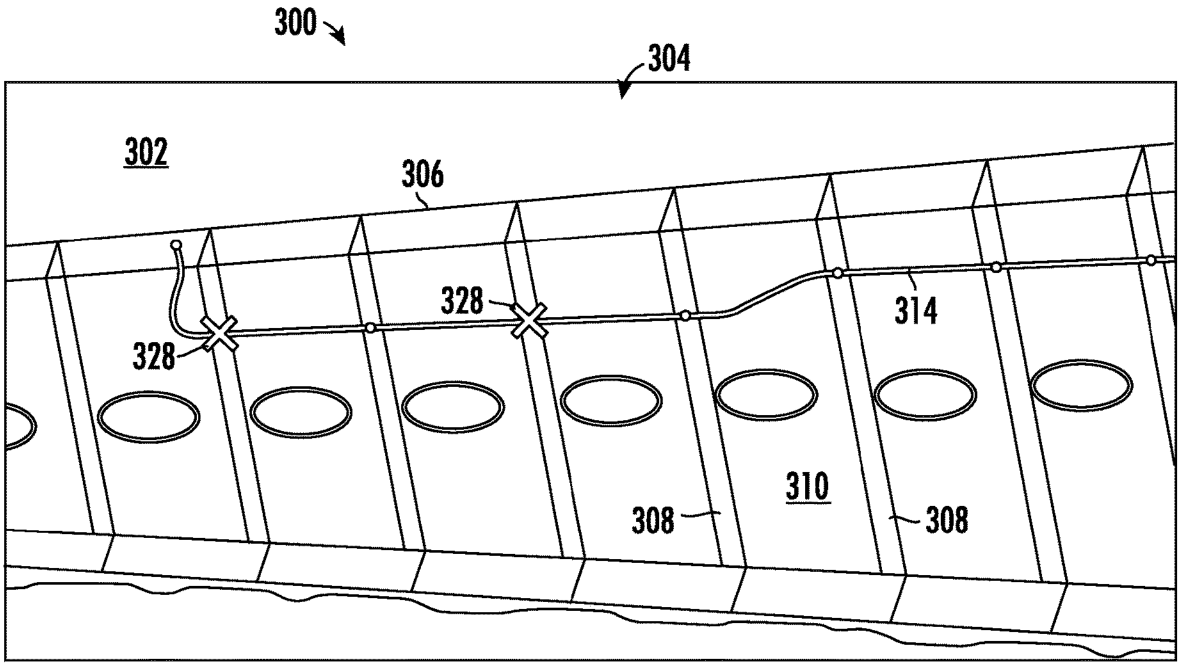

FIG. 3E illustrates a further example in which the analysis subsystem 210 is configured to further add bonds 328 to one or more of the apertures 312 through which system wiring is passed according to the designated routing. In these examples, again, the indicia 216 for indicating the recommended modification includes the bonds as added.

FIGS. 4A-4H are flowcharts illustrating various steps in a method 400 for analysis of electromagnetic effects (EME) on a structural section of an aircraft, according to various example implementations of the present disclosure. The method includes producing a computer-aided design (CAD) model of the structural section of the aircraft including a plurality of ribs defining bays, with apertures in one or more of the bays and identifiers of designated routing of system wiring through the one or more of the bays, as shown at block 402 of FIG. 4A. The method includes performing an engineering analysis of the structural section based on the CAD model to determine electrical threshold values for locations for the one or more of the bays, as shown at block 404. These electrical threshold values are related to an effect of electromagnetic radiation associated with an impact of an EME threat on the system wiring. The method includes identifying any of the locations at which an electrical threshold value exceeds a predetermined threshold associated with a keep-out distance relative to the system wiring, as shown at block 406. And the method includes generating an output including information of those of the locations that are identified, and indicia for indicating a recommended modification to at least one of the designated routing, the system wiring or the one or more of the bays in order to address the EME threat, as shown at block 408.

Figure 4A:
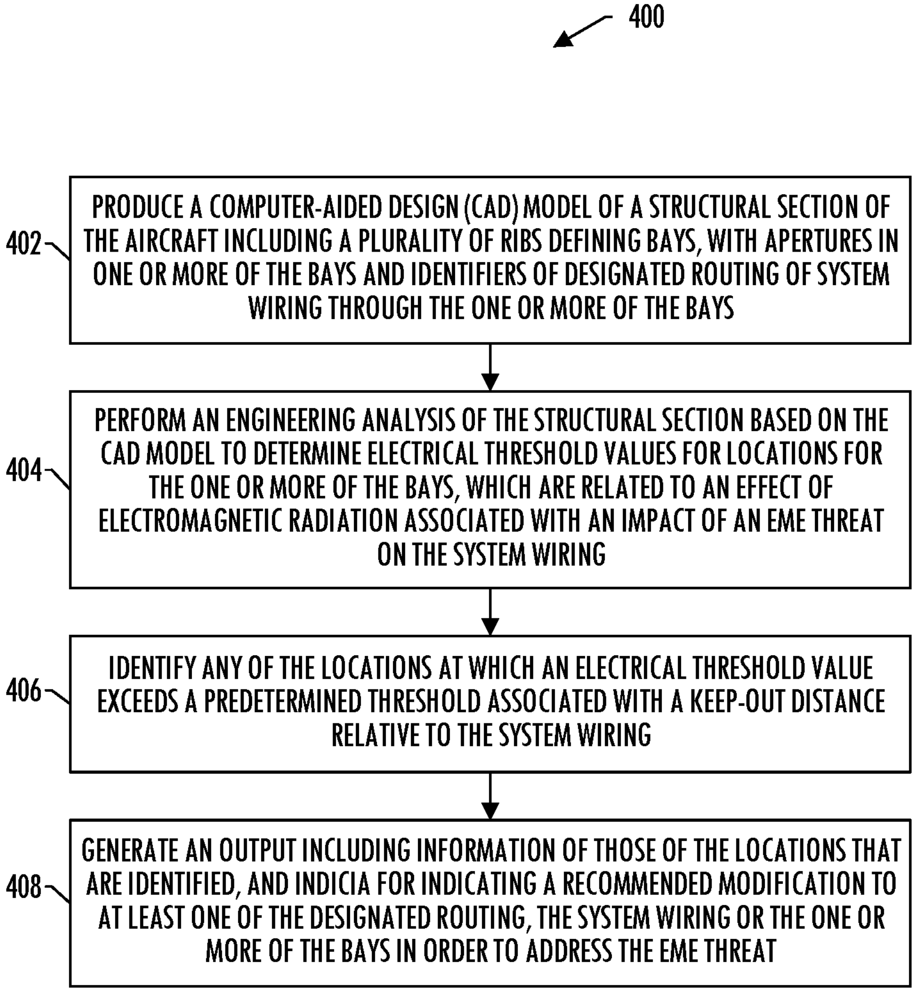
FIGS. 4A, 4B, 4C, 4D, 4E, 4F, 4G and 4H are flowcharts illustrating various steps in a method for analysis of electromagnetic effects (EME) on a structural section of an aircraft, according to example implementations.
Figure 4B:
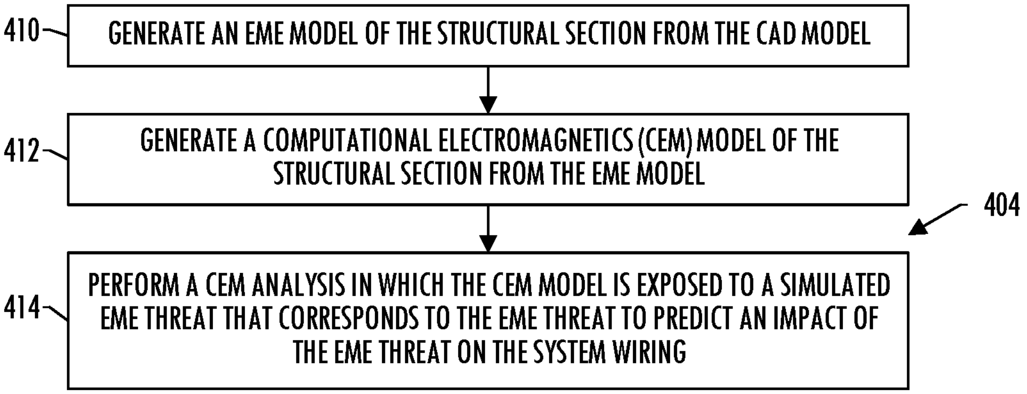

In some examples, the method 400 further includes generating an EME model of the structural section from the CAD model, as shown at block 410 of FIG. 4B. In some of these examples, generating a computational electromagnetics (CEM) model of the structural section from the EME model, as shown at block 412. And performing the engineering analysis at block 404 includes performing a CEM analysis in which the CEM model is exposed to a simulated EME threat that corresponds to the EME threat to predict an impact of the EME threat on the system wiring, as shown at block 414.

Figure 4C:
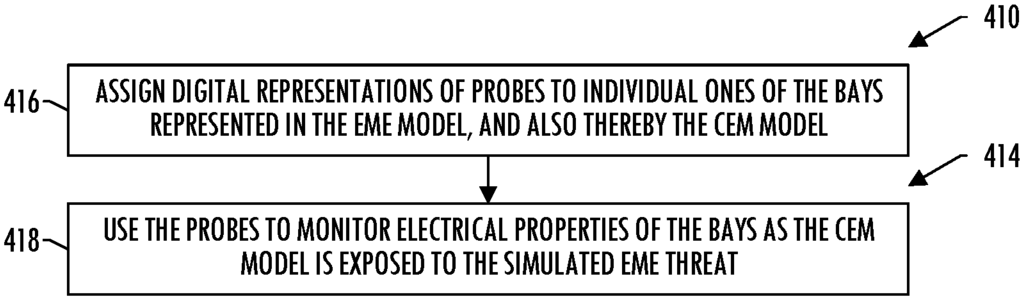
Figure 4D:

In some examples, generating the EME model at block 410 includes assigning digital representations of probes to individual ones of the bays represented in the EME model, as shown at block 416 of FIG. 4C. In some of these examples, also thereby the CEM model. And performing the CEM analysis at block 414 includes using the probes to monitor electrical properties of the bays as the CEM model is exposed to the simulated EME threat, as shown at block 418.

In some examples, the digital representations of the probes are assigned with a user-defined probe density. In some of these examples, performing the CEM analysis at block 414 includes using the probes to determine spacing between ribs of the plurality of ribs, as shown at block 420 of FIG. 4D.

Figure 4E:
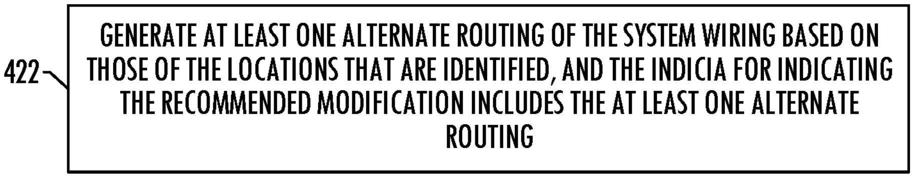

In some examples, the method 400 further includes generating at least one alternate routing of the system wiring based on those of the locations that are identified, as shown at block 422 of FIG. 4E. In some of these examples, the indicia for indicating the recommended modification includes the at least one alternate routing.

Figure 4F:
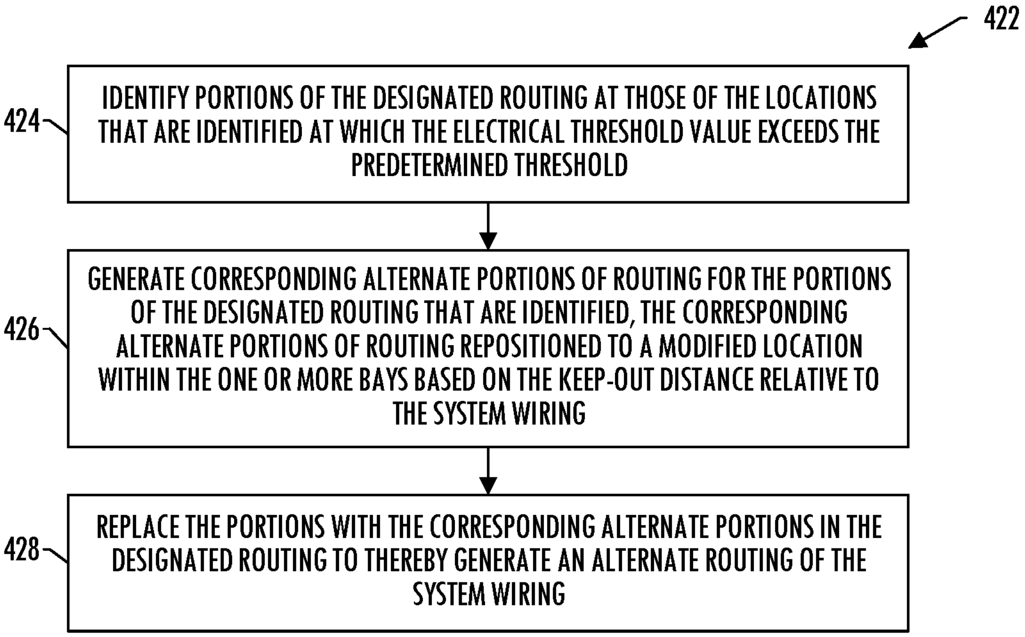

In some examples, generating the at least one alternate routing at block 422 includes identifying portions of the designated routing at those of the locations that are identified at which the electrical threshold value exceeds the predetermined threshold, as shown at block 424 of FIG. 4F. In some of these examples, method includes generating corresponding alternate portions of routing for the portions of the designated routing that are identified, as shown at block 426. Also in some of these examples, the corresponding alternate portions of routing are repositioned to a modified location within the one or more bays based on the keep-out distance relative to the system wiring. The portions, then, are replaced with the corresponding alternate portions in the designated routing to thereby generate an alternate routing of the system wiring, as shown at block 428.

Figure 4G:
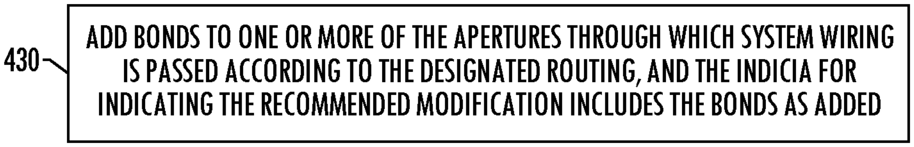

In some examples, the method 400 further includes adding bonds to one or more of the apertures through which system wiring is passed according to the designated routing, as shown at block 430 of FIG. 4G. In some of these examples, the indicia for indicating the recommended modification includes the bonds as added.

Figure 4H:

In some examples, the method further 400 includes generating at least one alternative predetermined threshold associated with the keep-out distance based on those of the locations that are identified, as shown at block 432 of FIG. 4H. In some of these examples, the indicia for indicating the recommended modification includes the at least one alternative predetermined threshold.

According to example implementations of the present disclosure, the system 200 and its subsystems may be implemented by various means. Means for implementing the system and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network or the like.

Figure 5:
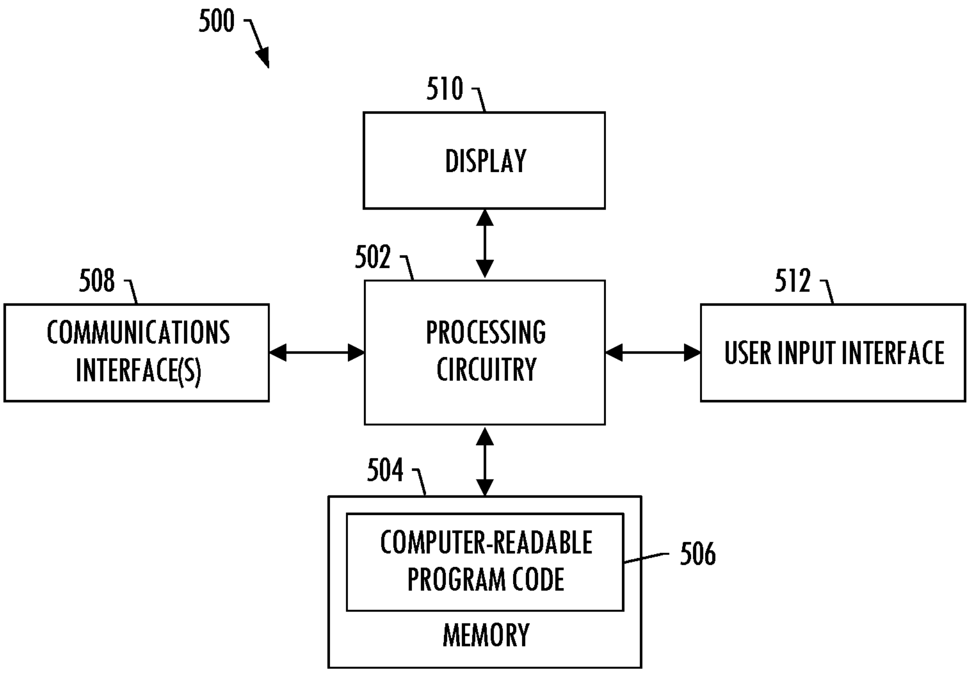
FIG. 5 illustrates an apparatus according to some example implementations.

FIG. 5 illustrates an apparatus 500 according to some example implementations of the present disclosure. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processing circuitry 502 (e.g., processor unit) connected to a memory 504 (e.g., storage device).

The processing circuitry 502 may be composed of one or more processors alone or in combination with one or more memories. The processing circuitry is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in the memory 504 (of the same or another apparatus).

The processing circuitry 502 may be a number of processors, a multi-core processor or some other type of processor, depending on the particular implementation. Further, the processing circuitry may be implemented using a number of heterogeneous processor systems in which a main processor is present with one or more secondary processors on a single chip. As another illustrative example, the processing circuitry may be a symmetric multi-processor system containing multiple processors of the same type. In yet another example, the processing circuitry may be embodied as or otherwise include one or more ASICs, FPGAs or the like. Thus, although the processing circuitry may be capable of executing a computer program to perform one or more functions, the processing circuitry of various examples may be capable of performing one or more functions without the aid of a computer program. In either instance, the processing circuitry may be appropriately programmed to perform functions or operations according to example implementations of the present disclosure.

The memory 504 is generally any piece of computer hardware that is capable of storing information such as, for example, data, computer programs (e.g., computer-readable program code 506) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 504, the processing circuitry 502 may also be connected to one or more interfaces for displaying, transmitting and/or receiving information. The interfaces may include a communications interface 508 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 510 and/or one or more user input interfaces 512 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processing circuitry that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by a processing circuitry, or storage of instructions in a computer-readable storage medium, supports combinations of operations for performing the specified functions. In this manner, an apparatus 500 may include a processing circuitry 502 and a computer-readable storage medium or memory 504 coupled to the processing circuitry, where the processing circuitry is configured to execute computer-readable program code 506 stored in the memory. It will also be understood that one or more functions, and combinations of functions, may be implemented by special purpose hardware-based computer systems and/or processing circuitry which perform the specified functions, or combinations of special purpose hardware and program code instructions.

As explained above and reiterated below, the present disclosure includes, without limitation, the following example implementations.

Clause 1. An apparatus for analysis of electromagnetic effects (EME) on a structural section of an aircraft, the apparatus comprising: a memory configured to store computer-readable program code; and processing circuitry configured to access the memory, and execute the computer-readable program code to cause the apparatus to at least: produce a computer-aided design (CAD) model of the structural section of the aircraft including a plurality of ribs defining bays, with apertures in one or more of the bays and identifiers of designated routing of system wiring through the one or more of the bays; perform an engineering analysis of the structural section based on the CAD model to determine electrical threshold values for locations for the one or more of the bays, which are related to an effect of electromagnetic radiation associated with an impact of an EME threat on the system wiring; identify any of the locations at which an electrical threshold value exceeds a predetermined threshold associated with a keep-out distance relative to the system wiring; and generate an output including information of those of the locations that are identified, and indicia for indicating a recommended modification to at least one of the designated routing, the system wiring or the one or more of the bays in order to address the EME threat.

Clause 2. The apparatus of clause 1, wherein the method, wherein the processing circuitry is configured to execute the computer-readable program code to cause the apparatus to further at least: generate an EME model of the structural section from the CAD model; and generate a computational electromagnetics (CEM) model of the structural section from the EME model, and wherein the apparatus caused to perform the engineering analysis includes the apparatus caused to perform a CEM analysis in which the CEM model is exposed to a simulated EME threat that corresponds to the EME threat to predict an impact of the EME threat on the system wiring.

Clause 3. The apparatus of clause 2, wherein the apparatus caused to generate the EME model includes the apparatus caused to assign digital representations of probes to individual ones of the bays represented in the EME model, and also thereby the CEM model, and wherein the apparatus caused to perform the CEM analysis includes the apparatus caused to use the probes to monitor electrical properties of the bays as the CEM model is exposed to the simulated EME threat.

Clause 4. The apparatus of clause 3, wherein the digital representations of the probes are assigned with a user-defined probe density, and the apparatus caused to perform the CEM analysis further includes the apparatus caused to use the probes to determine spacing between ribs of the plurality of ribs.

Clause 5. The apparatus of any of clauses 1 to 4, wherein the processing circuitry is configured to execute the computer-readable program code to cause the apparatus to further generate at least one alternate routing of the system wiring based on those of the locations that are identified, and the indicia for indicating the recommended modification includes the at least one alternate routing.

Clause 6. The apparatus of clause 5, wherein the apparatus caused to generate the at least one alternate routing includes the apparatus caused to: identify portions of the designated routing at those of the locations that are identified at which the electrical threshold value exceeds the predetermined threshold; generate corresponding alternate portions of routing for the portions of the designated routing that are identified, the corresponding alternate portions of routing repositioned to a modified location within the one or more bays based on the keep-out distance relative to the system wiring; and replace the portions with the corresponding alternate portions in the designated routing to thereby generate an alternate routing of the system wiring.

Clause 7. The apparatus of any of clauses 1 to 6, wherein the processing circuitry is configured to execute the computer-readable program code to cause the apparatus to further add bonds to one or more of the apertures through which system wiring is passed according to the designated routing, and the indicia for indicating the recommended modification includes the bonds as added.

Clause 8. The apparatus of any of clauses 1 to 7, wherein the processing circuitry is configured to execute the computer-readable program code to cause the apparatus to further generate at least one alternative predetermined threshold associated with the keep-out distance based on those of the locations that are identified, and the indicia for indicating the recommended modification includes the at least one alternative predetermined threshold.

Clause 9. A method of analysis of electromagnetic effects (EME) on a structural section of an aircraft, the method comprising: producing a computer-aided design (CAD) model of the structural section of the aircraft including a plurality of ribs defining bays, with apertures in one or more of the bays and identifiers of designated routing of system wiring through the one or more of the bays; performing an engineering analysis of the structural section based on the CAD model to determine electrical threshold values for locations for the one or more of the bays, which are related to an effect of electromagnetic radiation associated with an impact of an EME threat on the system wiring; identifying any of the locations at which an electrical threshold value exceeds a predetermined threshold associated with a keep-out distance relative to the system wiring; and generating an output including information of those of the locations that are identified, and indicia for indicating a recommended modification to at least one of the designated routing, the system wiring or the one or more of the bays in order to address the EME threat.

Clause 10. The method of clause 9, wherein the method further comprises: generating an EME model of the structural section from the CAD model; and generating a computational electromagnetics (CEM) model of the structural section from the EME model, and wherein performing the engineering analysis includes performing a CEM analysis in which the CEM model is exposed to a simulated EME threat that corresponds to the EME threat to predict an impact of the EME threat on the system wiring.

Clause 11. The method of clause 10, wherein generating the EME model includes assigning digital representations of probes to individual ones of the bays represented in the EME model, and also thereby the CEM model, and wherein performing the CEM analysis includes using the probes to monitor electrical properties of the bays as the CEM model is exposed to the simulated EME threat.

Clause 12. The method of clause 11, wherein the digital representations of the probes are assigned with a user-defined probe density, and performing the CEM analysis further includes using the probes to determine spacing between ribs of the plurality of ribs.

Clause 13. The method of any of clauses 9 to 12, wherein the method further comprises generating at least one alternate routing of the system wiring based on those of the locations that are identified, and the indicia for indicating the recommended modification includes the at least one alternate routing.

Clause 14. The method of clause 13, wherein generating the at least one alternate routing includes: identifying portions of the designated routing at those of the locations that are identified at which the electrical threshold value exceeds the predetermined threshold; generating corresponding alternate portions of routing for the portions of the designated routing that are identified, the corresponding alternate portions of routing repositioned to a modified location within the one or more bays based on the keep-out distance relative to the system wiring; and replacing the portions with the corresponding alternate portions in the designated routing to thereby generate an alternate routing of the system wiring.

Clause 15. The method of any of clauses 9 to 14, wherein the method further comprises adding bonds to one or more of the apertures through which system wiring is passed according to the designated routing, and the indicia for indicating the recommended modification includes the bonds as added.

Clause 16. The method of any of clauses 9 to 15, wherein the method further comprises generating at least one alternative predetermined threshold associated with the keep-out distance based on those of the locations that are identified, and the indicia for indicating the recommended modification includes the at least one alternative predetermined threshold.

Clause 17. A computer-readable storage medium for analysis of electromagnetic effects (EME) on a structural section of an aircraft, the computer-readable storage medium being non-transitory and having computer-readable program code stored therein that, in response to execution by processing circuitry, causes an apparatus to at least: produce a computer-aided design (CAD) model of the structural section of the aircraft including a plurality of ribs defining bays, with apertures in one or more of the bays and identifiers of designated routing of system wiring through the one or more of the bays; perform an engineering analysis of the structural section based on the CAD model to determine electrical threshold values for locations for the one or more of the bays, which are related to an effect of electromagnetic radiation associated with an impact of an EME threat on the system wiring; identify any of the locations at which an electrical threshold value exceeds a predetermined threshold associated with a keep-out distance relative to the system wiring; and generate an output including information of those of the locations that are identified, and indicia for indicating a recommended modification to at least one of the designated routing, the system wiring or the one or more of the bays in order to address the EME threat.

Clause 18. The computer-readable storage medium of clause 17, wherein the computer-readable storage medium has further computer-readable program code stored therein that, in response to execution by the processing circuitry, causes the apparatus to further at least: generate an EME model of the structural section from the CAD model; and generate a computational electromagnetics (CEM) model of the structural section from the EME model, and wherein the apparatus caused to perform the engineering analysis includes the apparatus caused to perform a CEM analysis in which the CEM model is exposed to a simulated EME threat that corresponds to the EME threat to predict an impact of the EME threat on the system wiring.

Clause 19. The computer-readable storage medium of clause 18, wherein the apparatus caused to generate the EME model includes the apparatus caused to assign digital representations of probes to individual ones of the bays represented in the EME model, and also thereby the CEM model, and wherein the apparatus caused to perform the CEM analysis includes the apparatus caused to use the probes to monitor electrical properties of the bays as the CEM model is exposed to the simulated EME threat.

Clause 20. The computer-readable storage medium of clause 19, wherein the digital representations of the probes are assigned with a user-defined probe density, and the apparatus caused to perform the CEM analysis further includes the apparatus caused to use the probes to determine spacing between ribs of the plurality of ribs.

Clause 21. The computer-readable storage medium of any of clauses 17 to 20, wherein the computer-readable storage medium has further computer-readable program code stored therein that, in response to execution by the processing circuitry, causes the apparatus to further generate at least one alternate routing of the system wiring based on those of the locations that are identified, and the indicia for indicating the recommended modification includes the at least one alternate routing.

Clause 22. The computer-readable storage medium of clause 21, wherein the apparatus caused to generate the at least one alternate routing includes the apparatus caused to: identify portions of the designated routing at those of the locations that are identified at which the electrical threshold value exceeds the predetermined threshold; generate corresponding alternate portions of routing for the portions of the designated routing that are identified, the corresponding alternate portions of routing repositioned to a modified location within the one or more bays based on the keep-out distance relative to the system wiring; and replace the portions with the corresponding alternate portions in the designated routing to thereby generate an alternate routing of the system wiring.

Clause 23. The computer-readable storage medium of any of clauses 17 to 22, wherein the computer-readable storage medium has further computer-readable program code stored therein that, in response to execution by the processing circuitry, causes the apparatus to further add bonds to one or more of the apertures through which system wiring is passed according to the designated routing, and the indicia for indicating the recommended modification includes the bonds as added.

Clause 24. The computer-readable storage medium of any of clauses 17 to 23, wherein the computer-readable storage medium has further computer-readable program code stored therein that, in response to execution by the processing circuitry, causes the apparatus to further generate at least one alternative predetermined threshold associated with the keep-out distance based on those of the locations that are identified, and the indicia for indicating the recommended modification includes the at least one alternative predetermined threshold.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for analysis of electromagnetic effects (EME) on a structural section of an aircraft, the apparatus comprising:

a memory configured to store computer-readable program code; and processing circuitry configured to access the memory, and execute the computer-readable program code to cause the apparatus to at least:

produce a computer-aided design (CAD) model of the structural section of the aircraft including a plurality of ribs defining bays, with apertures in one or more of the bays and identifiers of designated routing of system wiring through the one or more of the bays;

generate a computational electromagnetics (CEM) model of the structural section based on the CAD model;

perform an engineering analysis of the structural section based on the CAD model to determine electrical threshold values for locations for the one or more of the bays, which are related to an effect of electromagnetic radiation associated with an impact of an EME threat on the system wiring, wherein the performing the engineering analysis includes:

performing a CEM analysis in which the CEM model is exposed to a simulated EME threat, the CEM analysis including determining spacing between one or more ribs of the plurality of ribs, and monitoring electrical properties of the one or more of the bays as the CEM model is exposed to the simulated EME threat;

identify, of the locations for the one or more of the bays and based on performing the engineering analysis, one or more locations at which an electrical threshold value exceeds a predetermined threshold associated with a keep-out distance relative to the system wiring; and generate an output including information of those of the locations that are identified, and indicia of a recommended modification to at least one of the designated routing of the CAD model of the structural section, the system wiring of the CAD model of the structural section, or the one or more of the bays of the CAD model of the structural section in order to address the EME threat.

2. The apparatus of claim 1, wherein the processing circuitry is configured to execute the computer-readable program code to cause the apparatus to further at least:

generate an EME model of the structural section from the CAD model; and generate the CEM model of the structural section from the EME model.

3. The apparatus of claim 2, wherein the apparatus caused to generate the EME model includes the apparatus caused to assign digital representations of probes to individual ones of the bays represented in the EME model, and also thereby the CEM model, and wherein the apparatus caused to perform the CEM analysis includes the apparatus caused to use the probes to monitor electrical properties of the bays as the CEM model is exposed to the simulated EME threat.

4. The apparatus of claim 3, wherein the digital representations of the probes are assigned with a user-defined probe density, and the apparatus caused to perform the CEM analysis further includes the apparatus caused to use the probes to determine spacing between ribs of the plurality of ribs.

5. The apparatus of claim 1, wherein the processing circuitry is configured to execute the computer-readable program code to cause the apparatus to further generate at least one alternate routing of the system wiring based on those of the locations that are identified, and the indicia for indicating the recommended modification includes the at least one alternate routing.

6. The apparatus of claim 5, wherein the apparatus caused to generate the at least one alternate routing includes the apparatus caused to:

identify portions of the designated routing at those of the locations that are identified at which the electrical threshold value exceeds the predetermined threshold;

generate corresponding alternate portions of routing for the portions of the designated routing that are identified, the corresponding alternate portions of routing repositioned to a modified location within the one or more of the bays based on the keep-out distance relative to the system wiring; and replace the portions with the corresponding alternate portions in the designated routing to thereby generate an alternate routing of the system wiring.

7. The apparatus of claim 1, wherein the processing circuitry is configured to execute the computer-readable program code to cause the apparatus to further add bonds to one or more of the apertures through which the system wiring is passed according to the designated routing, and the indicia for indicating the recommended modification includes the bonds as added.

8. The apparatus of claim 1, wherein the processing circuitry is configured to execute the computer-readable program code to cause the apparatus to further generate at least one alternative predetermined threshold associated with the keep-out distance based on those of the locations that are identified, and the indicia for indicating the recommended modification includes the at least one alternative predetermined threshold.

9. A method of analysis of electromagnetic effects (EME) on a structural section of an aircraft, the method comprising:

producing a computer-aided design (CAD) model of the structural section of the aircraft including a plurality of ribs defining bays, with apertures in one or more of the bays and identifiers of designated routing of system wiring through the one or more of the bays;

generating a computational electromagnetics (CEM) model of the structural section based on the CAD model;

performing an engineering analysis of the structural section based on the CAD model to determine electrical threshold values for locations for the one or more of the bays, which are related to an effect of electromagnetic radiation associated with an impact of an EME threat on the system wiring, wherein the performing the engineering analysis includes:

performing a CEM analysis in which the CEM model is exposed to a simulated EME threat, the CEM analysis including determining spacing between one or more ribs of the plurality of ribs, and monitoring electrical properties of the one or more of the bays as the CEM model is exposed to the simulated EME threat;

identifying, of the locations for the one or more of the bays and based on performing the engineering analysis, one or more locations at which an electrical threshold value exceeds a predetermined threshold associated with a keep-out distance relative to the system wiring; and generating an output including information of those of the locations that are identified, and indicia of a recommended modification to at least one of the designated routing of the CAD model of the structural section, the system wiring of the CAD model of the structural section, or the one or more of the bays of the CAD model of the structural section in order to address the EME threat.

10. The method of claim 9, wherein the method further comprises:

generating an EME model of the structural section from the CAD model; and generating the CEM model of the structural section from the EME model.

11. The method of claim 10, wherein generating the EME model includes assigning digital representations of probes to individual ones of the bays represented in the EME model, and also thereby the CEM model, and wherein performing the CEM analysis includes using the probes to monitor electrical properties of the bays as the CEM model is exposed to the simulated EME threat.

12. The method of claim 11, wherein the digital representations of the probes are assigned with a user-defined probe density, and performing the CEM analysis further includes using the probes to determine spacing between ribs of the plurality of ribs.

13. The method of claim 9, wherein the method further comprises generating at least one alternate routing of the system wiring based on those of the locations that are identified, and the indicia for indicating the recommended modification includes the at least one alternate routing.

14. The method of claim 13, wherein generating the at least one alternate routing includes:

identifying portions of the designated routing at those of the locations that are identified at which the electrical threshold value exceeds the predetermined threshold;

generating corresponding alternate portions of routing for the portions of the designated routing that are identified, the corresponding alternate portions of routing repositioned to a modified location within the one or more of the bays based on the keep-out distance relative to the system wiring; and replacing the portions with the corresponding alternate portions in the designated routing to thereby generate an alternate routing of the system wiring.

15. The method of claim 9, wherein the method further comprises adding bonds to one or more of the apertures through which the system wiring is passed according to the designated routing, and the indicia for indicating the recommended modification includes the bonds as added.

16. The method of claim 9, wherein the method further comprises generating at least one alternative predetermined threshold associated with the keep-out distance based on those of the locations that are identified, and the indicia for indicating the recommended modification includes the at least one alternative predetermined threshold.

17. A computer-readable storage medium for analysis of electromagnetic effects (EME) on a structural section of an aircraft, the computer-readable storage medium being non-transitory and having computer-readable program code stored therein that, in response to execution by processing circuitry, causes an apparatus to at least:

produce a computer-aided design (CAD) model of the structural section of the aircraft including a plurality of ribs defining bays, with apertures in one or more of the bays and identifiers of designated routing of system wiring through the one or more of the bays;

generate a computational electromagnetics (CEM) model of the structural section based on the CAD model;

perform an engineering analysis of the structural section based on the CAD model to determine electrical threshold values for locations for the one or more of the bays, which are related to an effect of electromagnetic radiation associated with an impact of an EME threat on the system wiring, wherein the performing the engineering analysis includes:

performing a CEM analysis in which the CEM model is exposed to a simulated EME threat, the CEM analysis including determining spacing between one or more ribs of the plurality of ribs, and monitoring electrical properties of the one or more of the bays as the CEM model is exposed to the simulated EME threat;

identify of the locations for the one or more of the bays and based on performing the engineering analysis, one or more locations at which an electrical threshold value exceeds a predetermined threshold associated with a keep-out distance relative to the system wiring; and generate an output including information of those of the locations that are identified, and indicia of a recommended modification to at least one of the designated routing of the CAD model of the structural section, the system wiring of the CAD model of the structural section, or the one or more of the bays of the CAD model of the structural section in order to address the EME threat.

18. The computer-readable storage medium of claim 17, wherein the computer-readable storage medium has further computer-readable program code stored therein that, in response to execution by the processing circuitry, causes the apparatus to further at least:

generate an EME model of the structural section from the CAD model; and generate the CEM model of the structural section from the EME model.

19. The computer-readable storage medium of claim 18, wherein the apparatus caused to generate the EME model includes the apparatus caused to assign digital representations of probes to individual ones of the bays represented in the EME model, and also thereby the CEM model, and wherein the apparatus caused to perform the CEM analysis includes the apparatus caused to use the probes to monitor electrical properties of the bays as the CEM model is exposed to the simulated EME threat.

20. The computer-readable storage medium of claim 19, wherein the digital representations of the probes are assigned with a user-defined probe density, and the apparatus caused to perform the CEM analysis further includes the apparatus caused to use the probes to determine spacing between ribs of the plurality of ribs.

21. The computer-readable storage medium of claim 17, wherein the computer-readable storage medium has further computer-readable program code stored therein that, in response to execution by the processing circuitry, causes the apparatus to further generate at least one alternate routing of the system wiring based on those of the locations that are identified, and the indicia for indicating the recommended modification includes the at least one alternate routing.

22. The computer-readable storage medium of claim 21, wherein the apparatus caused to generate the at least one alternate routing includes the apparatus caused to:

identify portions of the designated routing at those of the locations that are identified at which the electrical threshold value exceeds the predetermined threshold;

generate corresponding alternate portions of routing for the portions of the designated routing that are identified, the corresponding alternate portions of routing repositioned to a modified location within the one or more of the bays based on the keep-out distance relative to the system wiring; and replace the portions with the corresponding alternate portions in the designated routing to thereby generate an alternate routing of the system wiring.

23. The computer-readable storage medium of claim 17, wherein the computer-readable storage medium has further computer-readable program code stored therein that, in response to execution by the processing circuitry, causes the apparatus to further add bonds to one or more of the apertures through which the system wiring is passed according to the designated routing, and the indicia for indicating the recommended modification includes the bonds as added.

24. The computer-readable storage medium of claim 17, wherein the computer-readable storage medium has further computer-readable program code stored therein that, in response to execution by the processing circuitry, causes the apparatus to further generate at least one alternative predetermined threshold associated with the keep-out distance based on those of the locations that are identified, and the indicia for indicating the recommended modification includes the at least one alternative predetermined threshold.

* * * * *